(12) United States Patent
Breuneval et al.

(10) Patent No.: US 10,955,478 B2
(45) Date of Patent: Mar. 23, 2021

(54) METHOD FOR MONITORING AN ELECTROMAGNETIC ACTUATOR TYPE APPARATUS

(71) Applicants: SAFRAN ELECTRONICS & DEFENSE, Boulogne Billancourt (FR); CENTRE NATIONAL DE LA RECHERCHE SCIENTIFIQUE, Paris (FR)

(72) Inventors: Romain Breuneval, Boulogne Billancourt (FR); Badr Mansouri, Boulogne Billancourt (FR); Emmanuel Boutleux, Boulogne Billancourt (FR); Guy Clerc, Boulogne Billancourt (FR); Julien Huillery, Boulogne Billancourt (FR); Ryan Michaud, Boulogne Billancourt (FR)

(73) Assignees: Safran Electronics & Defense, Boulogne Billancourt (FR); Centre National De La Recherche Scientifique, Paris (FR)

( * ) Notice: Subject to any disclaimer, the term of this patent is extended or adjusted under 35 U.S.C. 154(b) by 0 days.

(21) Appl. No.: 16/489,529

(22) PCT Filed: Feb. 21, 2018

(86) PCT No.: PCT/EP2018/054319
§ 371 (c)(1),
(2) Date: Aug. 28, 2019

(87) PCT Pub. No.: WO2018/162240
PCT Pub. Date: Sep. 13, 2018

(65) Prior Publication Data
US 2020/0116792 A1 Apr. 16, 2020

(30) Foreign Application Priority Data

Mar. 6, 2017 (FR) ..................... 1751812

(51) Int. Cl.
*G01R 31/34* (2020.01)
*G01M 13/02* (2019.01)
*G01R 31/00* (2006.01)

(52) U.S. Cl.
CPC ........... *G01R 31/343* (2013.01); *G01M 13/02* (2013.01); *G01R 31/008* (2013.01)

(58) Field of Classification Search
CPC ............................. G01R 31/343; G01M 13/02
(Continued)

(56) References Cited

U.S. PATENT DOCUMENTS 9,806,656 B1 * 10/2017 Pramod ................... H02P 23/14
10,267,860 B2 * 4/2019 Athikessavan ...... G01R 31/343
(Continued)

OTHER PUBLICATIONS

Ioannis Tsoumas et al, "Empirical Mode Decomposition of the stator start-up current for rotor fault diagnosis in asynchronous machines"; 18th International Conference on Electrical Machines, ICEM 2008, IEEE, Piscataway, NJ, Sep. 6, 2008, pp. 1-6, (XP 031436205).
(Continued)

*Primary Examiner* — Ricky Ngon
(74) *Attorney, Agent, or Firm* — Muncy, Geissler, Olds & Lowe, P.C.

(57) ABSTRACT

A monitoring method for monitoring equipment of electromechanical actuator type, the equipment including a three-phase electric motor, the monitoring method comprising the following steps: measuring three-phase currents powering the three-phase electric motor; projecting the three-phase currents into a Park reference frame; performing an ensemblist empirical mode decomposition processor the quadrature current coupled with a blind source separation process in order to obtain source components; from among the source components, automatically selecting a first set of source components sensitive to a first defect, and a second (Continued)

set of source components sensitive to a second defect; constructing a first virtual defect signal and a second virtual defect signal; and extracting a first set of signatures representative of the first defect from the first virtual defect signal, and extracting a second set of signatures representative of the second defect from the second virtual defect signal.

12 Claims, 3 Drawing Sheets

(58) Field of Classification Search
USPC .......................................................... 702/58
See application file for complete search history.

(56) References Cited

U.S. PATENT DOCUMENTS

| | | | | |
|---|---|---|---|---|
| 2010/0169030 | A1* | 7/2010 | Parlos | G01H 1/00 |
| | | | | 702/58 |
| 2013/0013138 | A1* | 1/2013 | Lu | B60L 3/0061 |
| | | | | 701/22 |
| 2013/0013231 | A1* | 1/2013 | Banerjee | B60L 3/0061 |
| | | | | 702/58 |
| 2015/0185288 | A1* | 7/2015 | Burke | G01R 31/343 |
| | | | | 318/490 |
| 2015/0293177 | A1 | 10/2015 | Ottewill et al. | |
| 2016/0097814 | A1* | 4/2016 | Kuruppu | H02P 21/22 |
| | | | | 324/522 |
| 2016/0266208 | A1* | 9/2016 | Athikessavan | H02P 29/0241 |
| 2016/0282416 | A1 | 9/2016 | Choi | |
| 2017/0003348 | A1* | 1/2017 | Fedigan | G01R 31/343 |
| 2018/0194391 | A1* | 7/2018 | Parette | B62D 5/0487 |

OTHER PUBLICATIONS

Dionysios V Spyropoulos et al, "Induction motor stator fault diagnosis technique using Park vector approach and complex wavelets"; XXth International Conference on Electrical Machines (ICEM), 2012, IEEE, Palais des Congrès et des Expositions de Marseille, Marseille, France, Sep. 2, 2012, pp. 1730-1734, (XP 032464949).

* cited by examiner

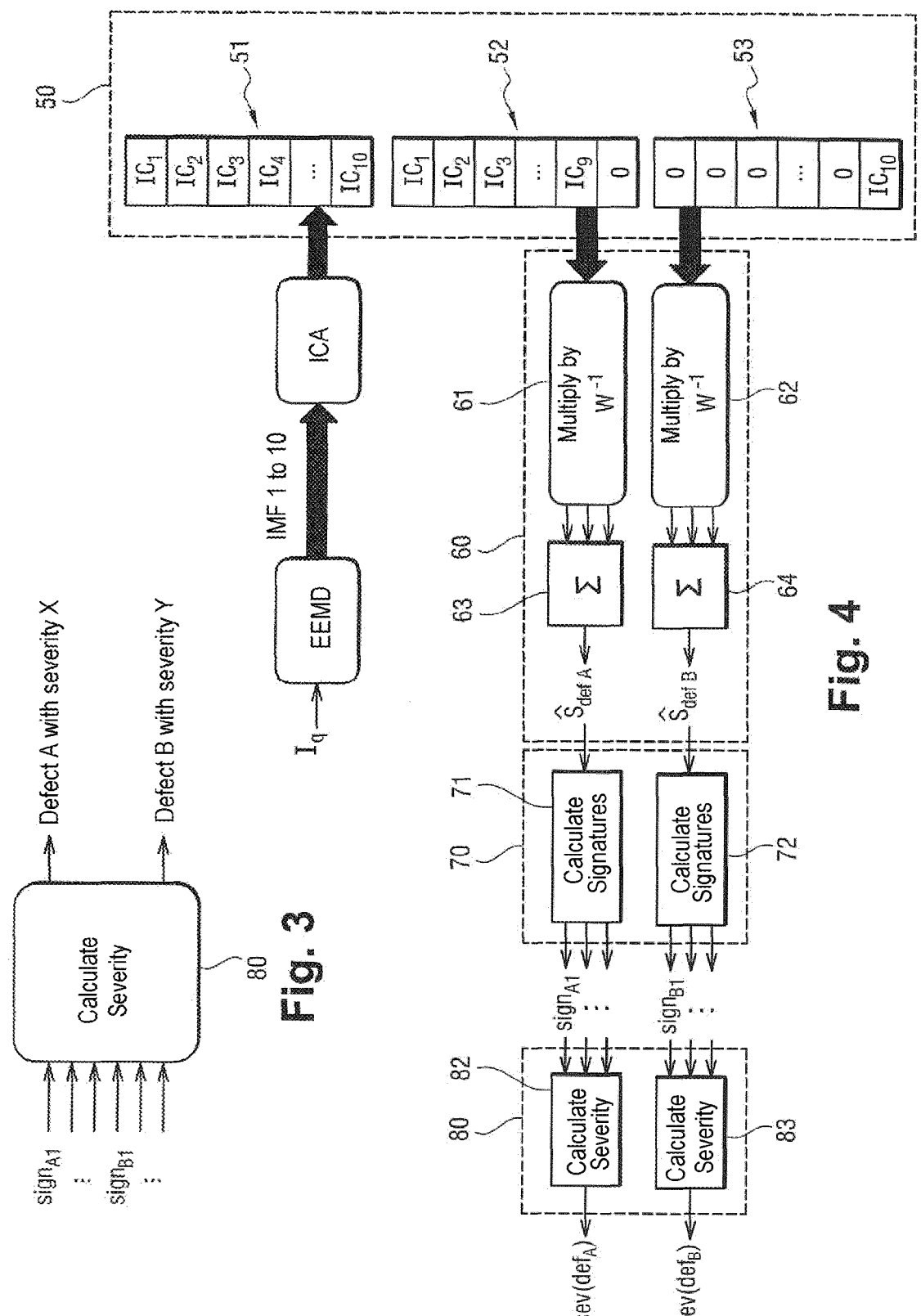

METHOD FOR MONITORING AN ELECTROMAGNETIC ACTUATOR TYPE APPARATUS

The invention relates to the field of methods of monitoring equipment of the electromechanical actuator type.

BACKGROUND OF THE INVENTION

So-called "health monitoring functions" (also referred to, less frequently, as conditional maintenance, predictive maintenance, or planned maintenance) are used in order to anticipate degradation of equipment or of a system, in particular in the field of aviation.

Health monitoring functions thus serve to avoid a failure, to optimize lifetime, to anticipate and plan maintenance operations (possibly including removal), and thus to reduce the cost of operations for maintaining the equipment or the system.

Conventionally, performing a health monitoring function comprises a data acquisition stage, a data preconditioning stage, a signature extraction stage, a diagnosis stage, and a prognosis stage.

The data acquisition stage consists in acquiring measurement data produced by sensors that measure parameters representative of performance of the equipment or of the system.

By way of example, data acquisition may be performed by testing, or by downloading from the equipment or from the system while it is in operation.

The data preconditioning stage consists in particular in filtering the data in order to remove measurement noise present in the data.

The signature extraction stage consists in processing the data in order to extract signatures therefrom that are representative of the state of the equipment or of the system, and possibly of degradation in the operation of the equipment or the system. Such degradation may be caused by the presence of one or more defects suffered by the equipment or by the system. The signatures are thus representative of the defect(s).

The diagnosis stage consists in particular in evaluating the signatures in order to estimate the state of the equipment or of the system, and in the presence of a defect, in order to locate and to evaluate the severity of said defect.

The prognosis stage consists in estimating the lifetime that remains for the equipment or the system.

OBJECT OF THE INVENTION

An object of the invention is to improve the sensitivity of signatures to defects in equipment or a system, and thus to improve the detection and the evaluation of the severity of said defects.

SUMMARY OF THE INVENTION

In order to achieve this object, there is provided a monitoring method for monitoring equipment of electromechanical actuator type, the equipment including a three-phase electric motor, the monitoring method comprising the following steps:

measuring three-phase currents powering the three-phase electric motor;

projecting the three-phase currents into a Park reference frame in order to obtain a quadrature current;

performing an ensemblist empirical mode decomposition process on the quadrature current coupled with a blind source separation process in order to obtain source components;

from among the source components, automatically selecting a first set of source components sensitive to a first defect, and a second set of source components sensitive to a second defect by using a selection criterion, the first defect and the second defect potentially degrading the operation of the equipment;

constructing a first virtual defect signal from the first set of source components and a second virtual defect signal from the second set of source components; and extracting a first set of signatures representative of the first defect from the first virtual defect signal, and extracting a second set of signatures representative of the second defect from the second virtual defect signal.

The monitoring method of the invention improves the sensitivity of the signatures of the first set of signatures to the first defect and of the signatures of the second set of signatures to the second defect, thereby improving detection of the first defect and of the second defect. When the severity of the first defect and the severity of the second defect are also calculated, the monitoring method of the invention also improves the evaluation of those severities.

The invention can be better understood in the light of the following description of a non-limiting particular implementation of the invention.

BRIEF DESCRIPTION OF THE DRAWINGS

Reference is made to the accompanying drawings, in which:

FIGS. 1 to 4 show successive steps in the monitoring method of the invention;

DETAILED DESCRIPTION OF THE INVENTION

Figure 1:
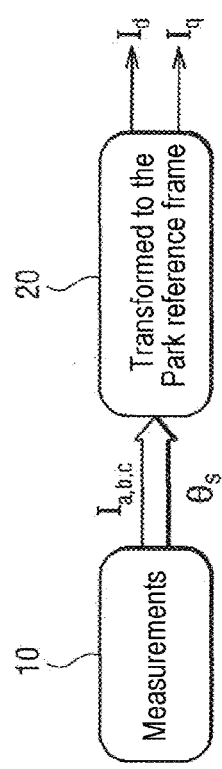
Figure 2:
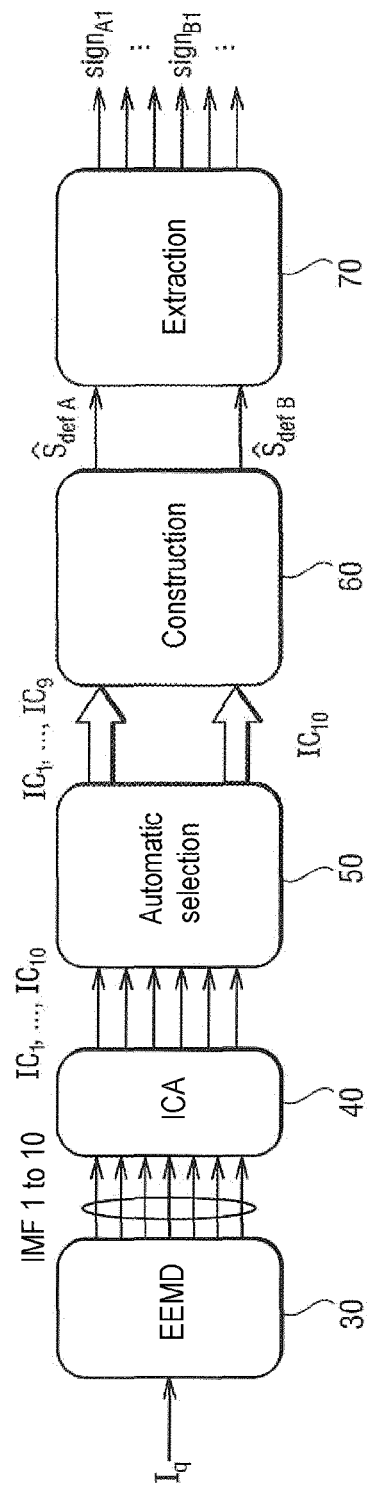

In this example, the monitoring method of the invention is performed on a linear electromechanical flight control actuator of an aircraft.

In this example, the linear electromechanical actuator comprises an electric motor of the permanent magnet three-phase synchronous motor type, a mechanical transmission that may be engaged directly or indirectly, an electronic power module that may optionally be remote, an electronic control module that may optionally be remote, and a set of sensors. In this example, the set of sensors comprises current sensors, a temperature probe, a force sensor, and a position sensor. The position sensor measures the angular position of the rotor of the electric motor.

The monitoring method of the invention serves to perform a health monitoring function on the linear electromechanical actuator.

As mentioned above, the health monitoring function comprises a data acquisition stage, a data preconditioning stage, a signature extraction stage, a diagnosis stage, and a prognosis stage.

The monitoring method of the invention comprises eight successive steps that are performed during the data preconditioning stage and the signature extraction stage.

By way of example, the monitoring method of the invention seeks to improve detection and evaluation of two defects that might degrade the operation of the linear electromechanical actuator: a first defect $def_A$ comprising a short circuit of the stator of the electric motor; and a second defect $def_B$ comprising seizing of the mechanical transmission.

With reference to FIGS. 1 to 4, the monitoring method of the invention begins with a measurement step 10 that consists in taking synchronous measurements of the three-phase currents $I_{a,b,c}$ powering the electric motor (where a, b, and c are the phases of the electric motor), and the angular position $\theta_s$ of the rotor of the electric motor.

The monitoring method of the invention then comprises a projection step 20 of projecting the three-phase current measurements taken during step 10 into the Park reference frame (a reference frame tied to the rotor and having its direct axis d in phase with the excitation flux). The Park transformation is performed using the following equation:

$$\begin{bmatrix} I_d \\ I_q \end{bmatrix} = \sqrt{\frac{2}{3}} \begin{bmatrix} \cos(\theta_s) & \cos\left(-\frac{2\pi}{3}+\theta_s\right) & \cos\left(+\frac{2\pi}{3}+\theta_s\right) \\ -\sin(\theta_s) & -\sin\left(-\frac{2\pi}{3}+\theta_s\right) & -\sin\left(+\frac{2\pi}{3}+\theta_s\right) \end{bmatrix} \begin{bmatrix} I_a \\ I_b \\ I_c \end{bmatrix}$$

In this example, $I_a$, $I_b$, and $I_c$ are the three-phase currents powering the electric motor, $I_d$ is the d or "direct" current in the Park reference frame, $I_q$ is the quadrature current in the Park reference frame, and $\theta_s$ is the electrical angular position of the rotating field of the stator of the electric motor.

The following applies:

$\theta_s$=npp*mechanical angular position of the rotor;

where npp is the number of pole pairs of the motor.

It should be observed that in FIG. 1 (and in the other figures), a narrow arrow corresponds to a single-channel signal, whereas each wide arrow corresponds to a multi-channel signal.

Thereafter, the monitoring method of the invention includes a step of performing an ensemblist empirical mode decomposition (EEMD) step. The ensemblist empirical mode decomposition is applied to the quadrature current $I_q$.

Performing the ensemblist empirical mode decomposition 30 involves performing an empirical mode decomposition (EMD).

The empirical mode decomposition seeks to decompose an arbitrary signal into a series of oscillating components known as intrinsic mode functions (IMFs).

Each oscillating component IMF is representative of phenomena over a range of frequencies.

An arbitrary signal y is decomposed by an empirical mode decomposition as follows:

$$y = \sum_{j=1}^{n} IMF_j + r,$$

where $IMF_j$ are the oscillating components IMF.

The signal r is a residual signal from which it is not possible to extract any more oscillating components IMF.

-n example of an EMD algorithm suitable for obtaining the oscillating components IMF is given below.

| Step | Inputs | Outputs | Tasks |
| --- | --- | --- | --- |
| Init | y | $r_1$ | Set $r_1 = y$ |
| 1 | $r_j$ | $R_{min}$; $R_{max}$ | Determining the local minima $R_{min} = \min_i[r_j]$ and the local maxima $R_{max} = \max_i[r_j]$ |
| 2 | $R_{min}$; $R_{max}$ | $e_{inf}$; $e_{sup}$ | Connect the minima (and also the maxima) together by respective cubic splines to form the bottom and top envelopes respectively |
| 3 | $e_{inf}$; $e_{sup}$; $r_j$ | $h_j$; $IMF_j$; $r_{j+1}$ | Calculate $h_j = r_j - \text{mean}(e_{sup}; e_{inf})$ Set $IMF_j = h_j$ Calculate $r_{j+1} = r_j - IMF_j$ |
| 4 | | | Repeat steps 1 to 3 until reaching the stop criterion |
| Stop | $r_j$ | | monotonic $r_j \Leftrightarrow e_{sup}$ and $e_{inf}$ symmetrical $\Leftrightarrow \text{mean}(e_{sup}; e_{inf}) = 0$ |

This type of algorithm is referred to as "sifting".

The first oscillating components IMF to be extracted are the oscillating components IMF of the signal y at high frequency, and the last oscillating components IMF to be extracted are the oscillating components IMF of the signal y at low frequency.

Performing the ensemblist empirical mode decomposition 30 consists in performing the empirical mode decomposition a certain number of times on noisy instances of a signal, and then in averaging the oscillating components IMF that are generated. This produces oscillating components IMF that are said to be "true".

Thus, an EEMD algorithm is used, and an example is given below.

| Step | Inputs | Outputs | Tasks |
| --- | --- | --- | --- |
| Init | y, N | $r_0$ | Set $r_0 = y$ and $N_{iter} = N$ (selected by user) |
| 1 | $r_0$; $\theta$ | $r_{1;wj}$ | Set $r_{1;wj} = r_0 + w(\theta)$ where $w(\theta)$: (random) white noise of known parameters $\theta$ |
| 2 | $r_{1;wj}$ | $IMF_{1-j}$ | Perform an EMD on $r_{1;wj}$ |
| 3 | | | Repeat 1 and 2 until j = N |
| 4: Final | $IMF_{1-j}$ | $IMF_j$ | Calculate the IMFs of the signal by averaging the IMFs for each noisy instance |

$$IMF_j = \left(\frac{1}{N_{iter}}\right) \sum_{i=1}^{N_{iter}} IMF_{1-i}$$

Using the ensemblist empirical mode decomposition 30 serves to avoid having a "mixture of modes", i.e. a superposition of high frequency signals on a low frequency signal for a given oscillating component IMF.

The monitoring method of the invention then includes a step of performing a blind source separation (BSS) process, that serves on the basis of observations to estimate a set of unknown sources. In this example, the blind source separation process that is used comprises independent component analysis (ICA) 40. The independent component analysis 40 uses the statistical independence criterion as its separation criterion.

As mentioned below, the sources involved in this example are signals representative of defects suffered by the linear electromechanical actuator, i.e. the first defect $def_A$ (short circuit of the stator of the electric motor), and the second defect $def_B$ (seizing of the mechanical transmission).

The independent component analysis 40 is performed on the true oscillating components (IMF 1 to 10 in FIGS. 2, 4, and 5), that constitute "virtual" observations serving to provide the inputs for the independent component analysis 40.

Independent component analysis 40 is thus coupled with ensemblist empirical mode decomposition 30.

The general principle of independent component analysis 40 is to estimate a set of sources ŝ from a set of observations x by defining a separation matrix W such that ŝ=Wx, while minimizing a separation criterion Φ (which in this example is the statistical independence criterion). In this example, the set of sources ŝ comprises an independent source component vector $IC_1$, $IC_2$, $IC_3$, . . . , $IC_n$.

The coupling gives rise to the following relationship:

$$\begin{bmatrix} IC_1 \\ IC_2 \\ \ldots \\ IC_n \end{bmatrix} = \begin{bmatrix} W_{11} & W_{12} & \ldots & W_{1n} \\ W_{21} & W_{22} & \ldots & W_{2n} \\ \vdots & \vdots & \vdots & \vdots \\ W_{n1} & W_{n2} & \ldots & W_{nn} \end{bmatrix} \begin{bmatrix} IMF_1 \\ IMF_2 \\ \ldots \\ IMF_n \end{bmatrix}.$$

The advantage of coupling the ensemblist empirical mode decomposition 30 with the independent component analysis 40 is to obtain signals that are much more sensitive to the first defect $def_A$ and to the second defect $def_B$ suffered by the linear electromechanical actuator, in comparison with a situation in which the ensemblist empirical mode decomposition 30 and the independent component analysis 40 are used singly and separately. The coupling produces signals that are typically 10 to 20 times more sensitive to the first defect $def_A$ and to the second defect $def_B$.

Figure 5:
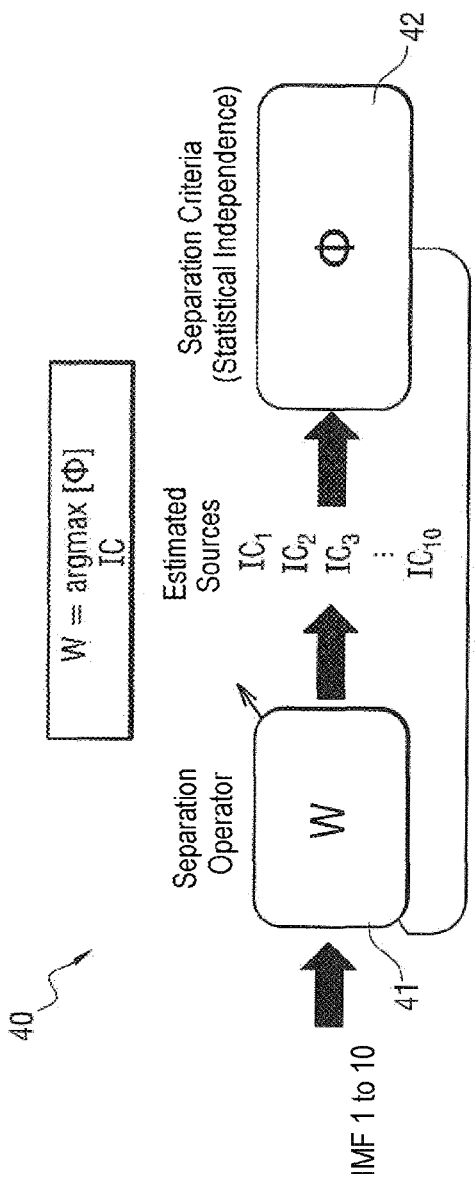
FIG. 5 shows a step of performing a blind source separation process in the monitoring method of the invention.

With reference to FIG. 5, the independent component analysis 40 is performed as follows.

The virtual observations, i.e. the true oscillating components IMF (IMF 1 to 10) are acquired.

The ICA algorithm is performed.

The separation matrix W is defined (step 41).

The separation matrix W may be made up of scalar coefficients $W_{ij}$. This is said to be an "instantaneous" situation. The separation matrix W may also be made up of finite impulse response filters (FIRs). This situation is then said to be "convolutional". For the convolutional situation, the order of the filters must be known a priori and thus defined before performing the independent component analysis.

The ICA algorithm seeks to solve the following problem:

$$W = \underset{IC}{\operatorname{argmax}}[\Phi]$$

The independent source components $IC_1$, $IC_2$, $IC_3$, . . . , $IC_{10}$ are then estimated by an iterative process.

The statistical independence criterion is reevaluated at each iteration, and the separation matrix W is redefined.

The monitoring method of the invention then comprises a step 50 of automatically selecting independent source components $IC_1$, $IC_2$, $IC_3$, . . . , $IC_{10}$.

The purpose of the automatic selection 50 is to select the independent source components $IC_1$, $IC_2$, $IC_3$, . . . , $IC_{10}$ in order to distinguish between the independent source components $IC_1$, $IC_2$, $IC_3$, . . . , $IC_{10}$ that are the most representative of the first defect $def_A$ and the independent source components $IC_1$, $IC_2$, $IC_3$, . . . , $IC_{10}$ that are the most representative of the second defect $def_B$.

The independent source components $IC_1$, $IC_2$, $IC_3$, . . . , $IC_{10}$ are selected on the basis of a selection criterion.

The selection criterion may be based on various statistical characteristics: mean, variance, coefficient of skewness, maximum, minimum, root mean square (rms) value, Kurtosis, etc.

The selection criterion is selected with reference to the defects under consideration, i.e. with reference to the first defect $def_A$ and the second defect $def_B$.

In this example, the selection criterion is based on calculating Kurtosis, which is defined as follows:

$$S_{Kur}(x) = \frac{\sum_{i=1}^{N}(x_i - \bar{x})^4}{N * (\sigma^2)^2}$$

where:

N is the sample size;

x̄ is the sample mean; and

σ is the sample variance.

With reference more particularly to FIG. 4, the automatic selection 50 thus produces a set of source components 51 that comprises the source components $IC_1$, $IC_2$, . . . , $IC_{10}$.

Thereafter, the source components $IC_1$, $IC_2$, . . . , $IC_{10}$ are tested on Kurtosis, and then rearranged.

This produces a first set of source components 52 of small Kurdosis, comprising the source components $IC_1$, $IC_2$, . . . , $IC_9$, and a second set of source components 53 of large Kurtosis, comprising the source components $IC_{10}$.

Thereafter, the monitoring method of the invention includes a construction step 60, which consists in constructing virtual source signals ŝ representative of the defects k (k thus represents the first defect $def_A$ or the second defect $def_B$).

This gives:

$$\hat{s}_k = \Sigma W^{-1}/C_{select\_k}$$

where $IC_{select\_k}$ correspond to selecting ICs for the defect k, i.e. to the first set of source components 52 (for the first defect $def_A$, k=A) and to the second set of source components 53 (for the second defect $def_B$, k=B).

The construction step 60 thus comprises multiplying the first set 52 by $W^{-1}$ (step 61) and multiplying the second set 53 by $W^{-1}$ (step 62).

Thereafter, the construction step 60 comprises summing (step 63) the components obtained after multiplying the first set 52 by $W^{-1}$, and summing (step 64) the components obtained after multiplying the second set 53 by $W^{-1}$.

This produces:

$\hat{s}_{defA}$, which is a first virtual defect signal presenting maximum sensitivity to the first defect $def_A$; and $\hat{s}_{defB}$, which is a second virtual defect signal presenting maximum sensitivity to the second defect $def_B$.

Thereafter, the monitoring method of the invention includes a step 70 of extracting signatures. The signature extraction step 70 consists in extracting a first signature $sign_A$ from the first virtual defect signal $\hat{s}_{defA}$ and extracting a second signature $sign_B$ from the second virtual defect signal $\hat{s}_{defB}$.

Signatures may be extracted using processes of a first type and of a second type.

Methods of the first type consist in calculating "global" statistical parameters over the first virtual defect signal $\hat{s}_{defA}$ and over the second virtual defect signal $\hat{s}_{defB}$. Global statistical parameters may for example be the average, the maximum, the Kurdosis, the number of zero crossings, etc.

Processes of the second type consist in defining combined parameters that result from combining global parameters with one another.

Thus, using a process of the second type, the following signature is constructed from the second virtual defect signal $\hat{s}_{defB}$ (seizing):

Sign=NbPeaks*AmpPP where:

NbPeaks is the number of times the second virtual defect signal $\hat{s}_{defB}$ passes above a predefined threshold in the sample; and AmpPP is the maximum peak to peak amplitude between two peaks of the second virtual defect signal $\hat{s}_{defB}$.

By way of example, other types of signature for the first defect $def_A$ are as follows:

the number of zero crossings. Zero crossings are counted only if the amplitude of the signal is greater than a certain threshold $\in_1$;

rms value, calculated as follows:

$$\left(\sum_{t=1}^{T} \hat{s}_{defA}(t)^2\right)^{\frac{1}{2}}$$

where T is the length of the signal, and t is time; and
energy, calculated by:

$$\left(\sum_{t=1}^{T} \hat{s}_{defA}(t)^2\right)$$

By way of example, other signatures for the second defect $def_B$ may be as follows:

the rms value, calculated by:

$$\left(\sum_{t=1}^{T} \hat{s}_{defB}(t)^2\right)^{\frac{1}{2}}$$

where T is the length of the signal, and t is time; and
energy, calculated by:

$$\left(\sum_{t=1}^{T} \hat{s}_{defB}(t)^2\right)$$

Finally, the monitoring method of the invention may include a step 80 of calculating the severity of the defects.

Severity calculation may be performed in various ways.

It is thus possible to make use of a metric on a signature, e.g. on the first signature $sign_A$:

$$sev(def_A) = \frac{|sign_A - sign_{A0}|}{|sign_{A0}|}$$

where $sign_{A0}$ is the value of the first signature for the first defect $def_A$ when the linear electromechanical actuator is first put into service.

Figure 6:
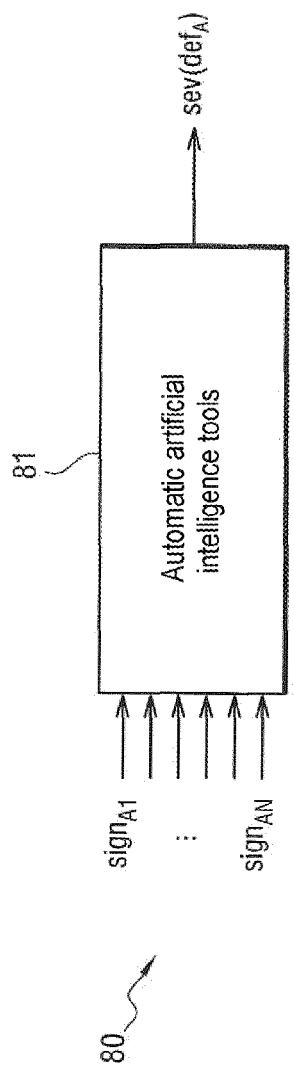
FIG. 6 shows a step of calculating severity in the monitoring method of the invention.

With reference to FIG. 6, it is also possible to apply a process 81 that relies on artificial intelligence tools (e.g. a process using neural networks, support vector machines, Bayesian networks).

The process 81 is applied to a plurality of signatures $sign_{A0}, \ldots, sign_{AN}$ in order to obtain the severity $sev(def_A)$.

This serves to estimate severity in a manner that is more accurate and more robust.

Naturally, the invention is not limited to the implementation described, but covers any variant coming within the ambit of the invention as defined by the claims.

Although the invention is described in application to a linear electromechanical actuator, the invention naturally applies to any other type of equipment.

Although the description applies to a defect concerning a short circuit in the stator of a three-phase electric motor and to a defect comprising seizing of a mechanical transmission, the invention naturally applies to other defects, and to some other number of defects.

The signatures (and the severity calculation) as used in the above examples for the first defects can also be used for the second defects, and vice versa.

The invention claimed is:

1. A monitoring method for monitoring estimating a state of equipment of electromechanical actuator type, the equipment including a three-phase electric motor, the monitoring method comprising:
    measuring three-phase currents powering the three-phase electric motor;
    projecting the three-phase currents into a Park reference frame in order to obtain a quadrature current;
    performing an ensemblist empirical mode decomposition process on the quadrature current coupled with a blind source separation process in order to obtain source components;
    from among the source components, automatically selecting a first set of source components sensitive to a first defect, and a second set of source components sensitive to a second defect by using a selection criterion, the first defect and the second defect potentially degrading the operation of the equipment;
    constructing a first virtual defect signal $\hat{s}_{def A}$ from the first set of source components and a second virtual defect signal $\hat{s}_{def B}$ from the second set of source components;
    extracting a first set of signatures representative of the first defect from the first virtual defect signal, and extracting a second set of signatures representative of the second defect from the second virtual defect signal:
    calculating a severity $sev(def_A)$ for the first defect and a severity $sev(def_B)$ for the second defect:
    estimating lifetime of the equipment based on a result of the calculation; and
    operating the equipment in accordance with the estimated lifetime.

2. The monitoring method according to claim 1, wherein the blind source separation process comprises independent component analysis using as its separation criterion a statistical independence criterion.

3. The monitoring method according to claim 1, wherein the automatic selection is performed by using a selection criterion selected with reference to the first defect and to the second defect and based on a statistical characteristic of the first set of source components and of the second set of source components.

4. The monitoring method according to claim 3, wherein the statistical characteristic is a Kurtosis.

5. The monitoring method according to claim 1, wherein the first signature and/or the second signature $sign_k$ is such that $Sign_k = NbPeaks*AmpPP$, where NbPeaks is the number of times the corresponding first virtual defect signal or second virtual defect signal becomes greater than a predefined threshold, and where AmpPP is a maximum peak to peak amplitude between two peaks of the corresponding first virtual defect signal or second virtual defect signal.

6. The monitoring method according to claim 1, wherein a signature from among the signatures of the first set of signatures or of the second set of signatures is an rms value calculated using:

$$\left(\sum_{t=1}^{T} \hat{s}_k(t)^2\right)^{\frac{1}{2}}$$

where $\hat{s}_k$ is the corresponding first virtual defect signal or the second virtual defect signal, T is the duration of $\hat{s}_k$, and t is time.

7. The monitoring method according to claim 1, wherein a signature from among the first set of signatures or the second set of signatures is an energy calculated using:

$$\left(\sum_{t=1}^{T} \hat{s}_k(t)^2\right),$$

where $\hat{s}_k$ is the corresponding first virtual defect signal or second virtual defect signal, T is the duration of $\hat{s}_k$, and t is time.

8. The monitoring method according to claim 1, wherein the severity $sev(def_k)$ of the first defect or of the second defect is calculated from the signature $sign_k$ of the corresponding first defect or second defect as follows:

$$sev(def_k) = \frac{|sign_k - sign_{k0}|}{|sign_{k0}|}$$

where $sign_{ko}$ is the value of the signature for the corresponding first defect or second defect at the beginning of the equipment being put into service.

9. The monitoring method according to claim 8, wherein the severity is calculated by a neural network or by a vector support machine or by a Bayesian network.

10. The monitoring method according to claim 1, wherein the first defect or the second defect is a short circuit of an electric motor stator.

11. The monitoring method according to claim 1, wherein the first defect or the second defect is seizing of a mechanical transmission.

12. The monitoring method according to claim 1, wherein the three-phase currents powering the three-phase electric motor are measured synchronously.

* * * * *